(12) United States Patent
Hayashi et al.

(10) Patent No.: US 8,088,652 B2
(45) Date of Patent: Jan. 3, 2012

(54) ELECTRON DEVICE USING OXIDE SEMICONDUCTOR AND METHOD OF MANUFACTURING THE SAME

(75) Inventors: Ryo Hayashi, Yokohama (JP); Masafumi Sano, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/949,389

(22) Filed: Nov. 18, 2010

(65) Prior Publication Data

US 2011/0065269 A1    Mar. 17, 2011

Related U.S. Application Data

(62) Division of application No. 12/123,103, filed on May 19, 2003, now Pat. No. 7,855,379.

(30) Foreign Application Priority Data

May 23, 2007  (JP) ................. 2007-136697

(51) Int. Cl.
*H01L 21/00* (2006.01)
(52) U.S. Cl. .. 438/149; 438/151; 438/514; 257/E21.334
(58) Field of Classification Search ........... 257/E21.334; 438/149, 151, 515
See application file for complete search history.

(56) References Cited

U.S. PATENT DOCUMENTS

| 7,189,992 | B2 | 3/2007 | Wager, III | |
| 2003/0218222 | A1* | 11/2003 | Wager et al. | 257/410 |
| 2007/0194379 | A1 | 8/2007 | Hosono | |
| 2010/0044701 | A1* | 2/2010 | Sano et al. | 257/43 |

FOREIGN PATENT DOCUMENTS

| JP | 8-264794 | 10/1996 |
| JP | 2002-76356 | 3/2002 |
| WO | WO2005088726 | 9/2005 |
| WO | WO2005093846 | 10/2005 |
| WO | WO2005093847 | 10/2005 |
| WO | WO2005093848 | 10/2005 |
| WO | WO2005093849 | 10/2005 |
| WO | WO2005093850 | 10/2005 |
| WO | WO2005093851 | 10/2005 |
| WO | WO2005093852 | 10/2005 |

OTHER PUBLICATIONS

Nomura et al., "Room-temperature fabrication of transparent flexible thin-film transistors using amorphous oxide semiconductors", Nature, vol. 432, Nov. 25, 2004, pp. 488-492.
English Translation of Nikkei Microdevices, Feb. 2006, p. 73, Fig. 7.

* cited by examiner

*Primary Examiner* — Minh-Loan T Tran
(74) *Attorney, Agent, or Firm* — Fitzpatrick, Cella, Harper & Scinto

(57) ABSTRACT

In an electron device in which plural thin film transistors each having at least a source electrode, a drain electrode, a semiconductor region including a channel, a gate insulation film and a gate electrode are provided on a substrate, a device separation region provided between the plural thin film transistors and the semiconductor region are constituted by a same metal oxide layer, and resistance of the semiconductor region is formed to be lower than resistance of the device separation region.

1 Claim, 5 Drawing Sheets

ELECTRON DEVICE USING OXIDE SEMICONDUCTOR AND METHOD OF MANUFACTURING THE SAME

This application is a division of U.S. application Ser. No. 12/123,103, filed May 19, 2008.

BACKGROUND OF THE INVENTION

1. Field of the Invention

The present invention relates to an electron device in which plural thin film transistors each using an oxide semiconductor (particularly, a metal oxide semiconductor) are provided, and a method of manufacturing the relevant electron device. The electron device like this is generally used for a display device such as an electroluminescent (EL) device or a liquid crystal cell.

2. Description of the Related Art

In recent years, as described in Japanese Patent Application Laid-Open No. 2002-076356, a thin film transistor (TFT) in which a transparent conductive metal oxide polycrystalline thin film using ZnO as its main component is used as the channel layer has been actively developed.

Since the transparent conductive metal oxide polycrystalline thin film can be deposited at low temperature and is transparent in relation to visible light, it is possible by using the relevant film to form a flexible transparent TFT on a substrate such as a plastic sheet, a plastic film or the like.

Further, International Publication Pamphlet of WO 2005/088726 and "Nature", Vol. 432 (2004-11), K. Nomura et al., pp. 488-492 describe a technique for using as the channel layer of an TFT a transparent amorphous metal oxide semiconductor film (a-IGZO) constituted by Indium, Gallium, Zinc and Oxygen. Further, these documents describe that a flexible transparent TFT having excellent field effect mobility of 6-9 $cm^2V^{-1} s^{-1}$ can be formed on a substrate such as a polyethylene terephthalate (PET) film or the like at room temperature.

Furthermore, "NIKKEI MICRODEVICES", February 2006, p. 73 (FIG. 7) describes that SiON is used for an insulation layer and a device separation region of a thin film transistor which uses a-IGZO as the channel layer.

Generally, a TFT, including an amorphous silicon thin film transistor (TFT), is formed by a large number of micro fabrication processes. Therefore, in case of manufacturing the TFT which stably operates at low cost, it is important to simplify the micro fabrication process.

If the transparent semiconductor film consisting of Zn and O as described in Japanese Patent Application Laid-Open No. 2002-076356, International Publication WO 2005/088726 and "Nature" is used as the channel region of the TFT, the following problems occur. That is, a conductive transparent metal oxide channel region is formed by a photolithography method and dry etching or wet etching. Since the dry etching is generally performed by using an expensive vacuum system, it increases manufacturing cost. For this reason, it is effective to use the wet etching in order to reduce the manufacturing cost. However, in the wet etching, there is a case where throughput decreases due to deterioration of accuracy in the micro fabrication process, limitation of device size by absorbed moisture to the channel region by a wet process, addition of a dry process, and the like.

SUMMARY OF THE INVENTION

Consequently, the present invention aims to enable simplification of manufacturing processes in plural thin film transistors each using a metal oxide semiconductor, to provide a stable electron device at low cost, and to provide a manufacturing method of the electron device.

The inventors of the present invention actively advanced research and development concerning a TFT which uses a transparent metal oxide semiconductor, and thus obtained the following knowledge which can solve the above-described problem by the structure described below. That is, a device separation region and a semiconductor region are constituted by the same metal oxide layer, and the relevant metal oxide layer is formed by a single depositing process. After then, a part of the high-resistance metal oxide layer is made to have low resistance, and the semiconductor region is formed on this condition, whereby an etching process for the semiconductor region can be omitted.

An electron device according to the present invention is characterized by an electron device in which plural thin film transistors each having at least a source electrode, a drain electrode, a semiconductor region including a channel, a gate insulation film and a gate electrode are provided on a substrate, wherein a device separation region provided between the plural thin film transistors and the semiconductor region are constituted by the same metal oxide layer, and resistance of the semiconductor region is formed to be lower than resistance of the device separation region.

A manufacturing method of an electron device according to the present invention is characterized by a method of manufacturing an electron device in which plural thin film transistors each having at least a source electrode, a drain electrode, a semiconductor region including a channel, a gate insulation film and a gate electrode are provided on a substrate, the method comprising: a first step of forming a metal oxide layer; and a second step of forming the semiconductor region by making a part of the metal oxide layer to have low resistance.

According to the electron device of the present invention, since the device separation region and the oxide semiconductor region are constituted by the same metal oxide layer, the device separation region and the oxide semiconductor region can be formed by a single depositing process. Further, since a part of the metal oxide layer is made to have low resistance and the semiconductor region is formed on this condition, an etching process for the semiconductor region can be omitted. Thus, by using such plural oxide semiconductor TFTs, the electron device which consists of low-cost and stable TFTs can be provided.

Further features of the present invention will become apparent from the following description of the exemplary embodiments with reference to the attached drawings.

DESCRIPTION OF THE EMBODIMENTS

Preferred embodiments of the present invention will now be described in detail in accordance with the accompanying drawings.

A metal oxide related to a device separation region and an oxide semiconductor region of the present invention is constituted by the same metal oxide layer (also called the same layer). It is preferable to use the metal oxide containing ZnO or In, Zn and O for the device separation region and the oxide semiconductor region between thin film transistors of the present embodiment. Such the metal oxide further contains at least one kind of component among In, Ga, Al, Fe, Sn, Mg, Ca, Si and Ge other than Zn and O, and it is preferable to use an amorphous metal oxide of which the resistivity is equal to or larger than $10^8$ $\Omega \cdot cm$. Furthermore, it is more preferable to use an amorphous metal oxide of which the resistivity is equal to or larger than $10^{10}$ $\Omega \cdot cm$.

An electron device composed of the thin film transistors of the present invention is used as a driver transistor of a display apparatus, and it is assumed to have accuracy of 211 ppi in the resolution. In this case, a pixel size in case of supposing a full-color display by three colors of red (R), green (G) and blue (B) becomes a sub-pixel (a pixel for one color when one pixel is formed by three colors) of 40 μm pitch in the short side direction and 120 μm pitch in the long side direction.

In a case that plural TFTs are arranged for this pixel size corresponding to a resolution level of 211 ppi, it is considered that a distance between source and drain electrodes in adjacent TFTs is about 10 μm and the wiring length within a pixel is about 100 μm.

Figure 1:
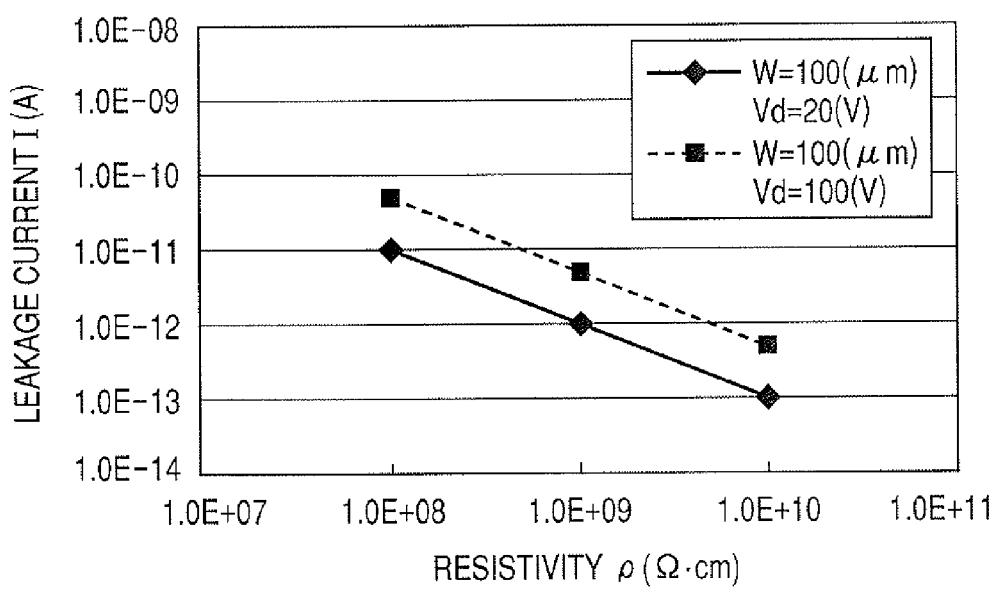
FIG. 1 is a graph indicating a leakage current by treating the resistivity of an inter-device separation film as a parameter when an electron device composed of plural TFTs (thin film transistors) of the present invention is used for a display apparatus.

FIG. 1 is a graph of estimating a leakage current by treating the resistivity of an inter-device separation film as a parameter assuming that thickness of this inter-device separation film is 50 nm. That is, in a case that plural TFTs are arranged for the pixel size corresponding to the resolution level of 211 ppi by treating the electron device composed of the thin film transistors of the present invention as the driver transistor of the display apparatus, the leakage current is indicated by treating the resistivity of the inter-device separation film as a parameter.

In FIG. 1, reference symbol W denotes length of source-drain electrodes and reference symbol Vd denotes voltage between source and drain electrodes. Since the leakage current is required to be equal to or less than $10^{-11}$ A when the TFTs of the present invention are used as driver TFTs of organic EL (electroluminescence) devices, the above-mentioned film resistivity is required.

In a polycrystalline conductive transparent oxide which contains a main component ZnO, the oxygen defect is tended to be easily interfused, therefore plenty of carrier electrons are generated. In addition, since grain boundary portions exist, it is difficult to increase the resistivity. For this reason, generation of the carrier electrons is suppressed and the element by which the oxide becomes the amorphous structure is added, thereby enabling to obtain a metal oxide thin film having the high resistivity equal to or larger than $10^{10}$ $\Omega \cdot cm$ sufficient to function as a device separation region.

In case of using the amorphous metal oxide containing In, Zn and O as the device separation region and the oxide semiconductor region, since the fabrication can be performed at the room temperature, if a sputtering method is used for also an insulation film, all the film formation (deposition) processes can be performed at the room temperature. In addition, a metal substrate or a glass substrate can be obviously used as the substrate, and a plastic substrate or a plastic film can be also used as the substrate.

First Embodiment

Coplanar TFT

Figure 2:
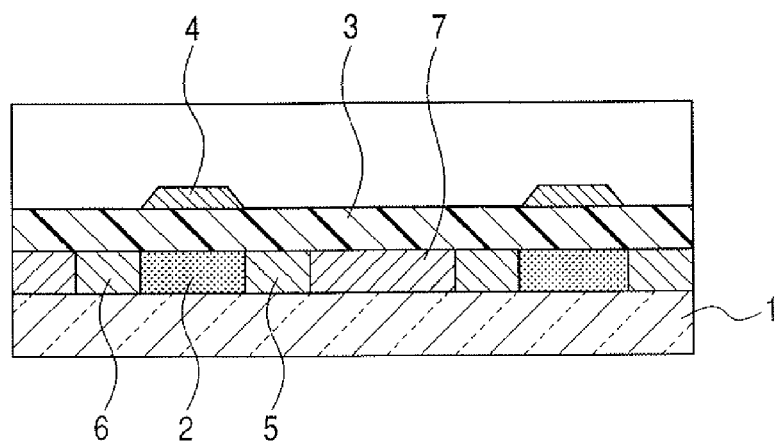
FIG. 2 is a schematic cross-sectional view indicating the structure of a top gate (coplanar) TFT as an example of a TFT according to the first embodiment.

FIG. 2 is a schematic cross-sectional view indicating the structure of a top gate (coplanar) TFT as an example of a thin film transistor according to the present embodiment.

A metal oxide layer 7 (high-resistance metal oxide layer) exhibiting the high resistivity equal to or larger than $10^{10}$ $\Omega \cdot cm$ is provided on a substrate 1. A semiconductor region 2 is provided by decreasing the resistance of a part of the metal oxide layer 7, and a device separation region and a channel region are formed. Furthermore, a source region 6 and a drain region 5 are provided by decreasing the resistance more than that in the semiconductor region. In this case, it is desirable to fix a resistance value within a range from a vale equal to or larger than $10^3$ $\Omega \cdot cm$ to a value equal to or less than $10^7$ $\Omega \cdot cm$. By adopting this resistance value, the field effect mobility equal to or larger than 1 $cm^2/Vs$ can be obtained. In addition, it is desirable that the resistance values of the source region and the drain region are equal to or less than $10^0$ $\Omega \cdot cm$ by further decreasing the resistance. As a means for decreasing the resistance, the decreasing of resistance by the implantation of hydrogen ions into a metal oxide layer or the decreasing of resistance by the irradiation of a high energy ray such as an X-ray can be performed.

Figure 3:
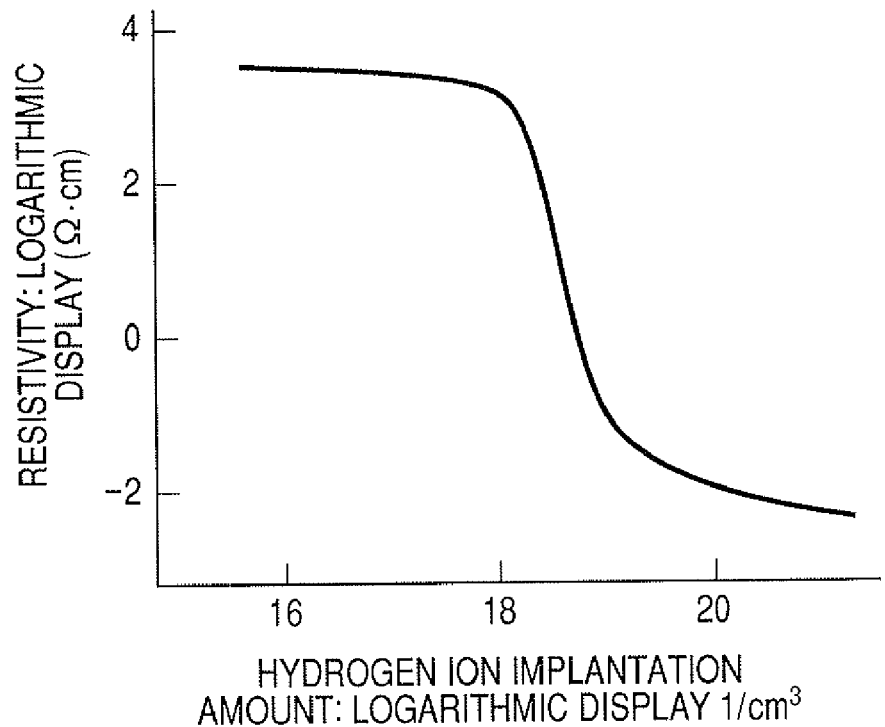
FIG. 3 is a graph indicating alteration of the resistivity when hydrogen ions are implanted into an amorphous In—Ga—Zn—O film.

FIG. 3 is a graph indicating alteration of the resistivity when hydrogen ions are implanted into an amorphous In—Ga—Zn—O film.

It can be controlled to set to the resistance functions as a semiconductor by implanting appropriate amount of hydrogen ions from $10^{18}$ $cm^{-3}$ to $10^{19}$ $cm^{-3}$. In this manner, the hydrogen concentration in the semiconductor region is made to become larger than that in the device separation region.

A coplanar TFT is constituted by providing a gate insulation film 3 composed of an oxide insulation layer and further providing a gate electrode 4 on the above-mentioned processed layer. In this manner, a complete coplanar top gate thin film transistor integrally forming the device separation region and the semiconductor region can be formed without using an etching process of the semiconductor region.

Second Embodiment

Inverse Staggered TFT

Figure 4:
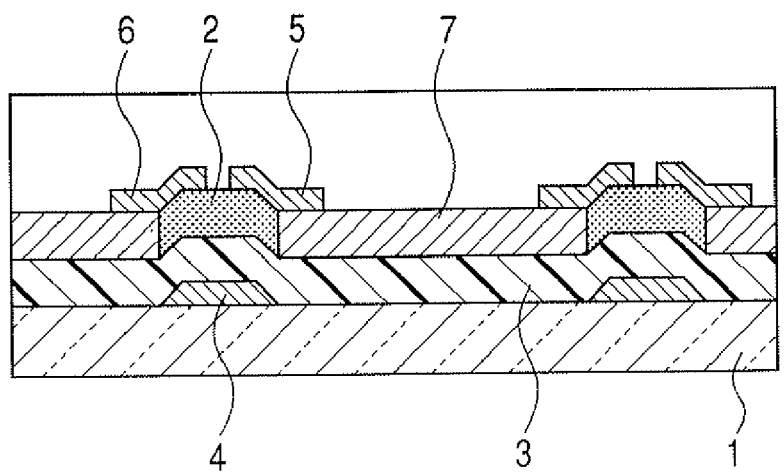
FIG. 4 is a schematic cross-sectional view indicating the structure of a bottom gate (inverse staggered) TFT as an example of a TFT according to the second embodiment.

FIG. 4 is a schematic cross-sectional view indicating the structure of a bottom gate (inverse staggered) TFT as an example of a TFT according to the present embodiment.

The gate electrode 4 is provided on the substrate 1, the gate insulation film 3 is provided on the gate electrode 4 and the metal oxide layer 7 (high-resistance metal oxide layer) exhibiting the high resistivity equal to or larger than $10^{10}$ $\Omega \cdot cm$ is further provided on the gate insulation film 3. The semiconductor region 2 is provided by decreasing the resistance of a part of the metal oxide layer 7, and a device separation region and a channel region are formed. An inverse staggered TFT is constituted by providing the source electrode 6 and the drain electrode 5 on this processed layer. In this case, similar to the first embodiment, it is desirable to fix a resistance value within a range from a value equal to or larger than $10^3$ Ω·cm to a value equal to or less than $10^7$ Ω·cm. By adopting this resistance value, the field effect mobility equal to or larger than 1 cm$^2$/Vs can be obtained. A process of decreasing the resistance to form a semiconductor region can be also performed after providing the source electrode 6 and the drain electrode 5.

In this manner, an inverse staggered bottom gate thin film transistor integrally forming the device separation region and the semiconductor region can be formed without using an etching process of the semiconductor region.

The amorphous structure can be confirmed by a fact that an obvious diffraction peak is not detected (that is, a halo pattern is observed) in case of performing an X-ray diffraction with a low incident angle of about 0.5° to a thin film to be measured. In the present embodiment, when the above-mentioned material is used for a device separation region and a semiconductor separation region of a field-effect transistor, it is not excluded that the device separation region and the semiconductor region contains the microcrystalline structural material.

Third Embodiment

Display Apparatus

A display apparatus can be constituted by connecting the drain electrodes serving as output terminals of the thin film transistors of the above-mentioned second embodiment with electrodes of display devices such as liquid crystal devices, organic or inorganic EL devices. Hereinafter, an example of specific display apparatus structure will be described by using a cross-sectional view of the display apparatus.

Figure 5:
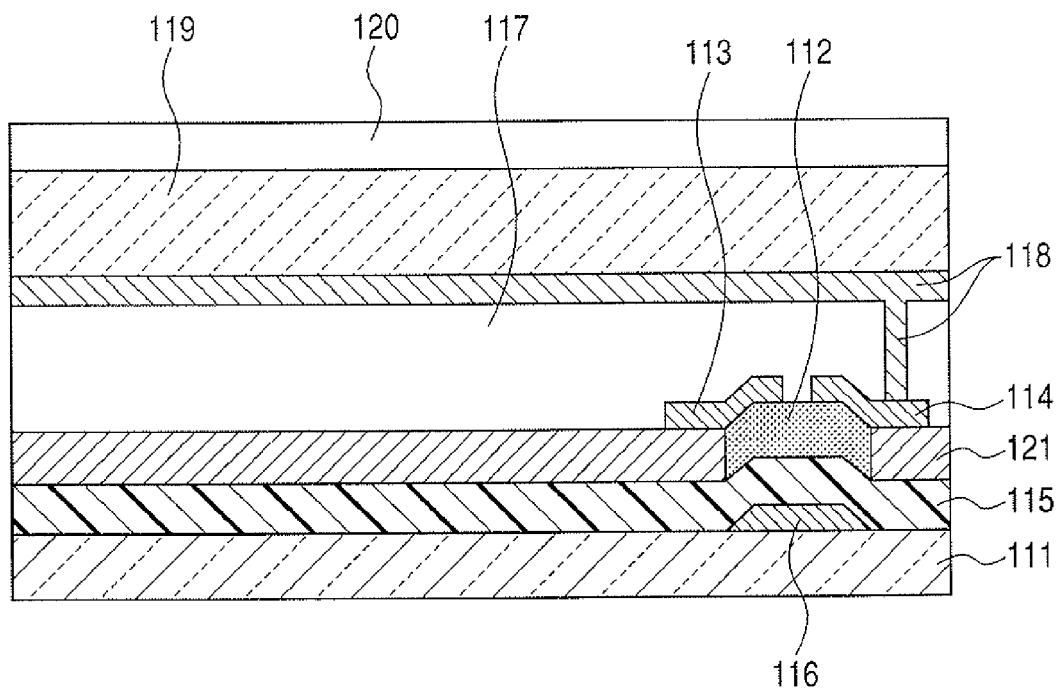
FIG. 5 is a cross-sectional view indicating an example of a display apparatus.

FIG. 5 is a cross-sectional view indicating an example of the display apparatus.

After forming a gate electrode 116 and a gate insulation film 115 on a base 111, a metal oxide layer 121 (high resistance metal oxide layer) of the present invention exhibiting the high resistivity is formed. In addition, after forming a source electrode 113 and a drain electrode 114, a channel region 112 is formed by decreasing the resistance of a part of the metal oxide layer by performing an annealing process in the inert gas, thereby forming a TFT. An electrode 118 is connected with the drain electrode 114 through an interlayer insulation film 117, and the electrode 118 adjoins with an emission layer 119, which further adjoins with an electrode 120. According to this structure, a current to be flowed into the emission layer 119 can be controlled by the value of a current which flows from the source electrode 113 to the drain electrode 114 through the channel region 112. Therefore, the current to be flowed into the emission layer can be controlled by the voltage of the gate electrode 116 of the TFT. Here, the electrode 118, the emission layer 119 and the electrode 120 constitute an organic or inorganic EL device.

Figure 6:
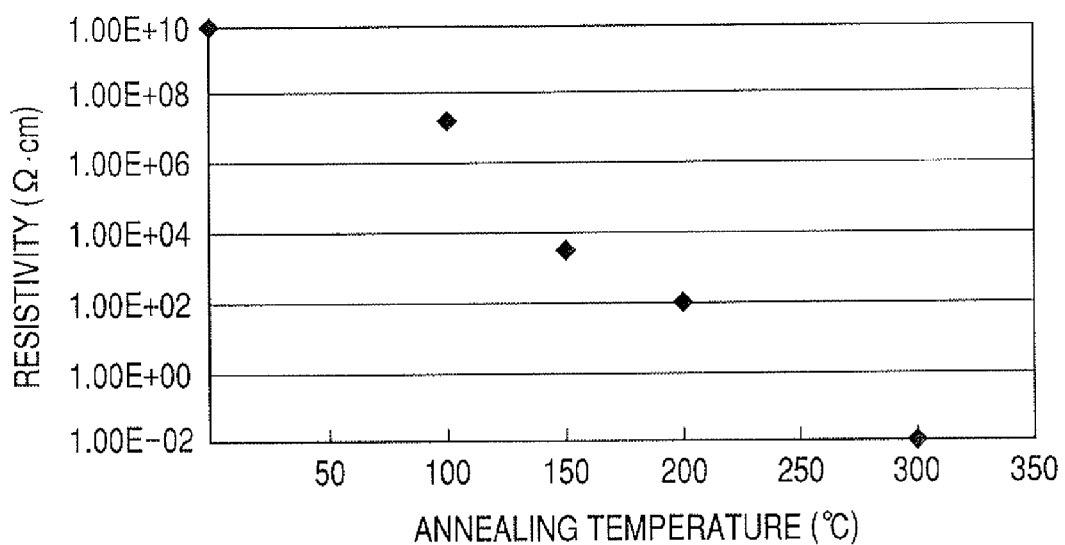
FIG. 6 is a view indicating alteration of the resistivity when the amorphous In—Ga—Zn—O film is annealed.

FIG. 6 is a view indicating alteration of the resistivity when the amorphous In—Ga—Zn—O film is annealed.

Next, another example of the specific display apparatus structure will be described.

Figure 7:
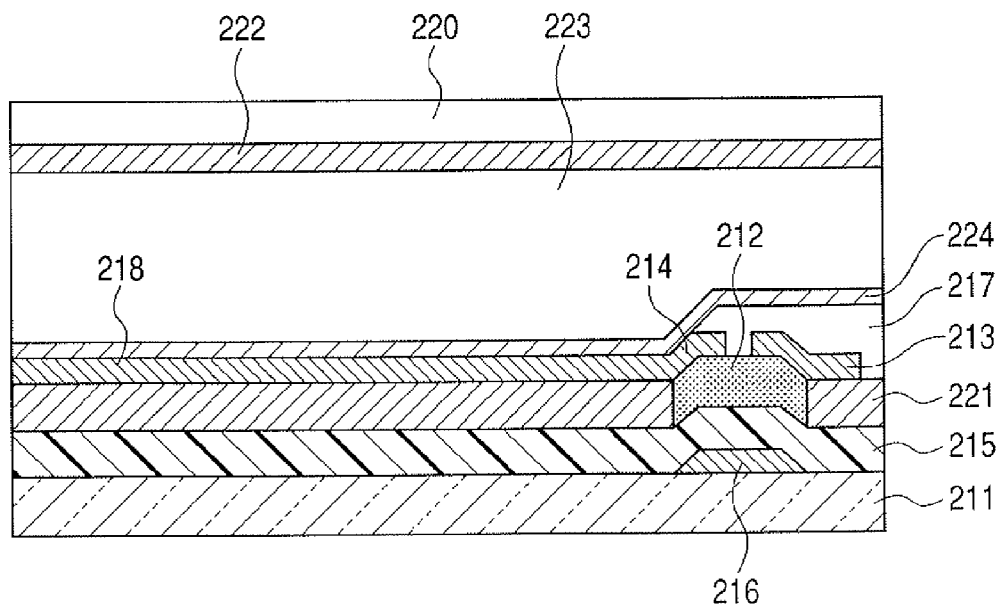
FIG. 7 is a cross-sectional view indicating another example of a display apparatus.

FIG. 7 is a cross-sectional view indicating another example of a display apparatus.

After forming a gate electrode 216 and a gate insulation film 215 on a base 211, a metal oxide layer 221 (high resistance metal oxide layer) of the present invention exhibiting the high resistivity is formed. In addition, after forming a source electrode 213 and a drain electrode 214, a channel region 212 is formed by decreasing the resistance of a part of the metal oxide layer by performing an annealing process in the inert gas, thereby forming a TFT. Reference numeral 217 denotes an insulation film.

The drain electrode 214, which is extended, also functions as an electrode 218, and it can be constituted that the electrode 218 is treated as an electrode of supplying the voltage to a liquid crystal cell or an electrophoretic particle cell 223 pinched between high resistance films 222 and 224. The liquid crystal cell or the electrophoretic particle cell 223, the high resistance films 222 and 224, the electrode 218 and an electrode 220 constitute a display device. The voltage to be applied to the display devices can be controlled by the value of a current which flows from the source electrode 213 to the drain electrode 214 through the channel region 212. Therefore, the voltage to be applied to the display devices can be controlled by the voltage of the gate electrode 216 of the TFT. Here, if a display medium of the display device is a capsule of sealing fluid and particles into an insulation film, the high resistance films 222 and 224 are not required.

In the above-mentioned two examples, the examples, in which a pair of electrodes for driving the display device is provided parallel to the base, are illustrated. However, the present embodiment is not always limited to the present structure. For example, if the connection between the drain electrode serving as an output terminal of the TFT and the display device is topologically identical, either electrode or both electrodes may be vertically provided to the base.

Additionally, in the above-mentioned two examples, only the one TFT to be connected to the display device is illustrated. However, the present invention is not always limited to the present structure. For example, the TFT indicated in the figure may be connected to other TFTs according to the present invention, and the TFT indicated in the figure is allowed to be an end stage of a circuit by these TFTs.

In a case that a pair of electrodes for driving the display device is provided parallel to the base, if the display device is a reflective display device such as an EL device or a reflective liquid crystal device, either electrode has to be transparent for the luminescence wavelength or the reflected light wavelength. Alternatively, if the display device is a transmissive display device such as a transmissive liquid crystal device, both electrodes have to be transparent for the transmitted light.

Furthermore, in the TFT of the present embodiment, all the structural members can be made transparent. Accordingly, a transparent display device can be also formed. In addition, this display device can be also provided on a low heat-resistance base such as a lightweight flexible transparent resinous plastic substrate.

Next, a display apparatus, where the pixels containing EL devices (here, organic EL devices) and thin film transistors are two dimensionally arranged, will be described.

Figure 8:
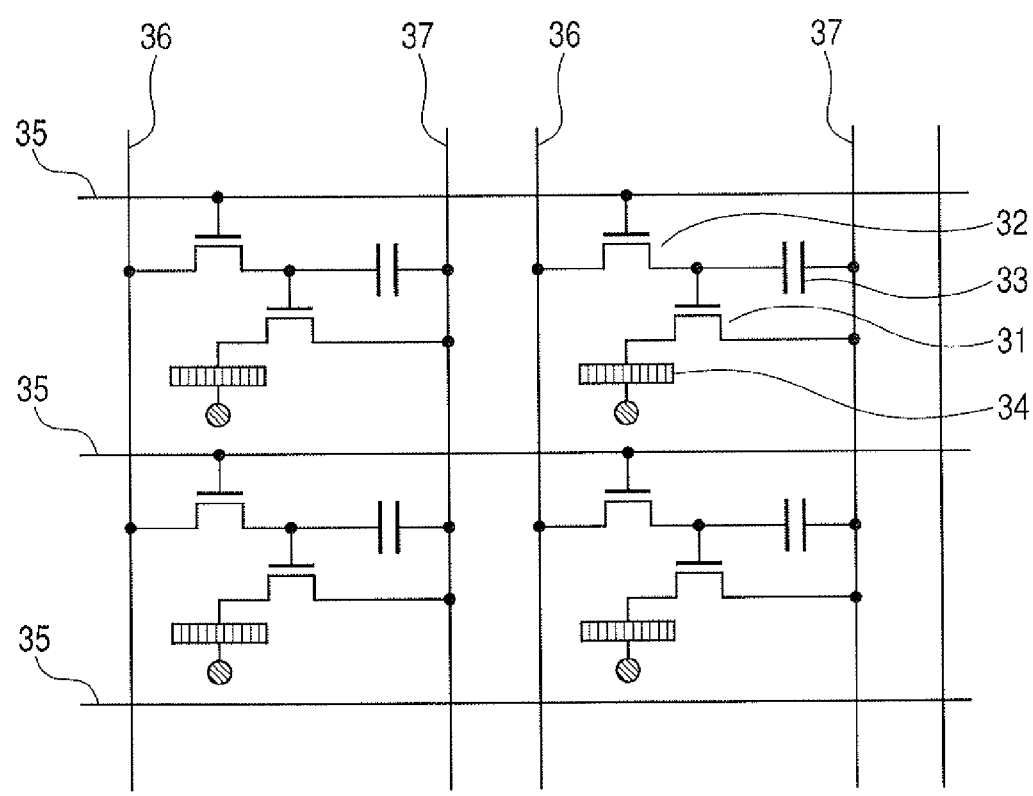
FIG. 8 is a view indicating the structure of a display apparatus, where pixels containing organic EL devices and thin film transistors are two-dimensionally arranged.

FIG. 8 is a view indicating the structure of the display apparatus, where the pixels containing the organic EL devices and the thin film transistors are two-dimensionally arranged.

A transistor 31 drives an organic EL layer 34 and a transistor 32 selects pixels. A capacitor 33, which is used to hold the selected condition, accumulates the charge between a common electrode wire 37 and a source portion of the transistor 32 and holds a gate signal of the transistor 31. The selection of pixels is determined through a scanning electrode wire 35 and a signal electrode wire 36.

If describing more specifically, an image signal is applied from a driver circuit (not illustrated) to a gate electrode passing through the scanning electrode wire 35 as a pulse signal. At the same time, the image signal is applied from another driver circuit (not illustrated) to the transistor 32 passing through the signal electrode wire 36 also as a pulse signal and then pixels are selected. At that time, the transistor 32 is turned ON, and the charge is accumulated into the capacitor 33 located between the signal electrode wire 36 and a source portion of the transistor 32. According to this process, the gate voltage of the transistor 31 is held at the desired voltage and the transistor 31 is turned ON. This condition is held until a next signal is received. During a state that the transistor 31 is turned ON, the voltage and current are continuously supplied to the organic EL layer 34 and the luminescent state is maintained.

In an example indicated in FIG. 8, although it is constituted that two transistors and one capacitor are used for one pixel, many transistors and the like may be further embedded in order to improve the performance.

Next, embodiments of the present invention will be described by using the attached drawings.

Embodiment 1

In the present embodiment, a formation method of a coplanar (top gate) MISFET (Metal Insulator Semiconductor Field Effect Transistor) device of the first embodiment indicated in FIG. 2 will be described.

First, a metal oxide layer 7 (high-resistance metal oxide layer) exhibiting the high resistivity equal to or larger than $10^{10}$ Ω·cm is provided on a substrate 1. That is, an amorphous In—Ga—Zn—O film, of which thickness is 40 nm and metal composition ratio becomes In:Ga:Zn=1.00:0.94:0.65, to be used as a device separation region and a semiconductor region is formed on a glass substrate 1 (Corning Corporation product 1737) by a sputtering method at the room temperature. Note that the sintered compact having the metal composition ratio of In:Ga:Zn=1:1:1 is used as the target. In this case, the oxygen-argon mixture gas is used as the sputtering gas, and the total pressure of the oxygen-argon mixture gas is set to become $5.0\times10^{-1}$ Pa and the partial pressure of the oxygen is set to become $6.5\times10^{-2}$ Pa. With regard to a film obtained in this manner, it becomes possible to obtain a metal oxide thin film having the high resistivity equal to or larger than $10^{10}$ Ω·cm sufficient to function as the device separation region.

Next, after forming a mask on the device separation region of that metal oxide film by a photolithography method, a semiconductor region 2 having the resistivity equal to $10^3$ Ω·cm is formed by implanting hydrogen ions of which amount is $10^{18}$ cm$^{-3}$. Additionally, after forming a mask on the semiconductor region 2 by the photolithography method, source and drain regions 5 and 6 having the resistivity equal to $10^{-1}$ Ω·cm are formed by implanting hydrogen ions of which dose amount is $10^{19}$ cm$^{-3}$.

On this structured layer, a gate insulation film 3 using the a-SiO$_x$ (amorphous silicon oxide) is formed 200 nm by the sputtering method. In this case, the SiO$_2$ target material is used as the sputtering target material and the oxygen-argon mixture gas is used as the sputtering gas. Additionally, on this formed insulation film, a layer of Ti5 nm/Au40 nm is laminated to form a gate electrode (gate terminal) 4 by the photolithography method and a lift-off method.

With regard to this MISFET device, it becomes possible to realize the field effect mobility equal to or larger than 1 cm$^2$/Vs and the off current equal to or less than 1E-11(A).

According to the above, a complete coplanar (top gate) MISFET device integrally forming a device separation region and a semiconductor region can be completed without using an etching process of the semiconductor region.

Embodiment 2

In the present embodiment, a formation method of an inverse staggered (bottom gate) MISFET device of the second embodiment indicated in FIG. 4 will be described.

First, a gate electrode 4 composed of a layer of Ti10 nm/Au100 nm was formed on a glass substrate 1 (Corning Corporation product 1737) by using the photolithography method and the lift-off method.

Additionally, on this formed electrode 4, a gate insulation film 3 using the a-SiO$_x$ is formed 100 nm by the sputtering method. In this case, the SiO$_2$ target material is used as the sputtering target material and the oxygen-argon mixture gas is used as the sputtering gas. On this formed insulation film, a metal oxide layer 7 (high-resistance metal oxide layer) exhibiting the high resistivity equal to or larger than $10^{10}$ Ω·cm is provided. That is, an amorphous In—Ga—Zn—O film, of which thickness is 40 nm and metal composition ratio becomes In:Ga:Zn=1.00:0.94:0.65, to be used for a device separation region and a semiconductor region is formed by a sputtering method at the room temperature. In this case, the oxygen-argon mixture gas is used as the sputtering gas, and the total pressure of the oxygen-argon mixture gas is set to become $5.0\times10^{-1}$ Pa and the partial pressure of the oxygen is set to become $6.5\times10^{-2}$ Pa. With regard to a film obtained in this manner, it becomes possible to obtain a metal oxide thin film having the high resistivity equal to or larger than $10^{10}$ Ω·cm sufficient to function as the device separation region.

Thereafter, the a-SiO$_x$ which is an insulation layer transparent to the light within a visual light range and the high-resistance amorphous In—Ga—Zn—O film are heated by a lamp. Since only the gate electrode 4 absorbs and reflects light from the lamp, only an upper portion of the gate electrode can be locally heated to the temperature within a range from 150° C. to 200° C., and the semiconductor region 2 is formed.

At the last, a layer of Au100 nm/Ti5 nm is deposited by an electron beam evaporation method, then the source and drain electrodes 5 and 6 are formed by the photolithography method and the lift-off method. In this manner, the inverse staggered (bottom gate) MISFET device indicated in FIG. 4 integrally forming the device separation region and the semiconductor region can be completed without using an etching process of the semiconductor region.

With regard to this MISFET device, it becomes possible to realize the field effect mobility equal to or larger than 1 cm$^2$/Vs and the off current equal to or less than 1E-11(A).

Embodiment 3

In the present embodiment, an image display apparatus using the TFTs of the third embodiment indicated in FIG. 7 will be described. A manufacturing process of the TFT is similar to that in the Embodiment 2.

In the above-mentioned TFT, a short side of the island structure of an ITO (indium tin oxide) film to form the drain electrode is extended to 100 μm, and an extended portion of 90 μm is remained to ensure wirings to the source electrode and the gate electrode, then the TFT is coated by an insulation layer. On this coated layer, a polyimide film is applied and then a rubbing process is performed. On the other hand, the member obtained by similarly forming the ITO film and the polyimide film on a plastic substrate then performing the rubbing process, is prepared. This prepared member is oppositely faced with the above-mentioned substrate on which the TFT was formed to have a space of 5 μm between them, and the nematic liquid crystal is implanted into this space.

Additionally, a pair of polarizing plates is provided on both sides of this structured member. Here, when the voltage to be applied to the gate electrode is made to vary by applying the voltage to the source electrode of the TFT, the transmittance of only a region of 30 μm×90 μm which is a part of the island structure of the ITO film extended from the drain electrode is varied. The optical remittance can be continuously varied by also the voltage between the source and drain electrodes under such the gate voltage by which the TFT becomes an ON state. In this manner, a display apparatus, where the liquid crystal cell corresponding to that in FIG. 7 is treated as the display device, is fabricated.

In the present embodiment, as a substrate for forming a TFT, a white plastic substrate is used, and it is constituted that each electrode of the TFT is replaced by Au and the polyimide film and the polarizing plates are eliminated. And, it may be constituted that a capsule of coating particles and fluid by an insulation film is made to be filled in a space between white and transparent substrates. In case of a display apparatus by this constitution, the voltage between the drain electrode extended by the TFT and the ITO film of an upper portion is controlled, therefore the particles in the capsule move up and down. Accordingly, a displaying operation can be performed by controlling reflectance of an extended drain electrode region observed from a transparent substrate side.

Also, in the present embodiment, for example, a current control circuit by the ordinary structure of 4-transistor/1-capacitor is constituted by forming that plural TFTs are adjoined, and the EL device can be also driven by treating one of the final stage transistors of that circuit as the TFT indicated in FIG. 5. For example, a TFT in which the above-mentioned ITO film is treated as a drain electrode is used. And, an organic electroluminescent device composed of a charge implantation layer and an emission layer is formed in a region of 30 μm×90 μm which is a part of the island structure of the ITO film extended from the drain electrode. In this manner, a display apparatus using the EL devices can be formed.

Embodiment 4

The display devices and TFTs of the Embodiment 3 are made to be two dimensionally arranged. For example, the pixel, which includes display devices such as liquid crystal cells or EL devices and the TFTs mentioned in the Embodiment 3 and occupies an area of about 30 μm×115 μm, is arranged by a manner that the pixels of 7425×1790 pieces are respectively arranged in rectangular with a pitch of 40 μm in the short side direction and a pitch of 120 μm in the long side direction. And, 1790 gate wirings, which pass through gate electrodes of 7425 TFTs in the long side direction, are provided, and 7425 signal wirings, which pass through portions that source electrodes of 1790 TFTs protruded 5 μm from the island structure of an amorphous metal oxide semiconductor film in the short side direction, are provided. Then, these wirings are respectively connected with gate driver circuits and source driver circuits. Furthermore, in case of a liquid crystal display device, if a color filter, which performs a repetition display of RGB colors in the long side direction after performing the alignment with the same size as that of the liquid crystal display device, is provided on a surface, an active matrix color image display apparatus of A4 size with the resolution of about 211 ppi can be constituted.

Also, in the EL device, a gate electrode of first TFT is wired with a gate wiring and a source electrode of second TFT is wired with a signal wiring in the two TFTs included in one EL device. Furthermore, the luminescence wavelength of the EL device is made to perform a repetition display with RGB colors in the long side direction. In this manner, a luminescent color image display device having the same resolution can be constituted.

Here, a driver circuit for driving an active matrix may be constituted by using the TFTs of the present invention same as those in the pixels or an existing IC chip.

INDUSTRIAL APPLICABILITY

Electron devices composed of thin film transistors (TFTs) related to the present invention can be applied as switching devices of a LCD (Liquid Crystal Display) or an EL display. In addition, all the formation processes concerning the TFT can be performed on a flexible material such as a plastic film at the low temperature, and this technology can be widely applied to a flexible display, an IC card, an ID tag and the like.

While the present invention has been described with reference to the exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-136697, filed May 23, 2007, which is hereby incorporated by reference herein in its entirety.

What is claimed is:

1. A method of manufacturing an electron device in which plural thin film transistors each having at least a source electrode, a drain electrode, a semiconductor region including a channel, a gate insulation film and a gate electrode are provided on a substrate, the method comprising:
    a first step of forming a metal oxide layer; and
    a second step of forming the semiconductor region by making a part of the metal oxide layer to have low resistance
    wherein the second step includes a step of implanting a hydrogen ion to a part of the metal oxide layer.

* * * * *